(12) United States Patent
Cudak et al.

(10) Patent No.: US 11,641,722 B2
(45) Date of Patent: May 2, 2023

(54) ELECTRONIC DEVICE WITH EXTENDABLE GRIPPING FEET AND CORRESPONDING METHODS

(71) Applicant: Motorola Mobility LLC, Chicago, IL (US)

(72) Inventors: Gary D Cudak, Wake Forest, NC (US); John S Crowe, Durham, NC (US); Jennifer J Lee-Baron, Morrisville, NC (US); Nathan J Peterson, Oxford, NC (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 17/358,637

(22) Filed: Jun. 25, 2021

(65) Prior Publication Data

US 2022/0418132 A1 Dec. 29, 2022

(51) Int. Cl.
*H05K 5/02* (2006.01)
(52) U.S. Cl.
CPC ................................ *H05K 5/0234* (2013.01)
(58) Field of Classification Search
None
See application file for complete search history.

(56) References Cited

U.S. PATENT DOCUMENTS

| | | | | |
|---|---|---|---|---|
| 7,059,182 | B1* | 6/2006 | Ragner | H04M 1/185 |
| | | | | 73/200 |
| 9,557,813 | B2* | 1/2017 | Yairi | G06F 3/016 |
| 9,571,150 | B2* | 2/2017 | Sanford | H04M 1/185 |
| 9,715,257 | B2* | 7/2017 | Manullang | H04M 1/185 |
| 9,973,231 | B1* | 5/2018 | Buvid | H04B 1/3888 |
| 10,001,813 | B1* | 6/2018 | Tang | H05K 5/0017 |
| 10,289,381 | B2 | 5/2019 | McDunn et al. | |
| 10,315,828 | B2* | 6/2019 | Rivellini | H01F 7/064 |
| 10,420,031 | B2 | 9/2019 | Alameh et al. | |
| 10,482,727 | B2 | 11/2019 | Herrmann et al. | |
| 10,505,577 | B2* | 12/2019 | Lin | G06F 1/1656 |

(Continued)

FOREIGN PATENT DOCUMENTS

CN 107122010 A * 9/2017

OTHER PUBLICATIONS

"CatTongue Grips—Gripping Solutions", https://cattonguegrips.com; Viewed online Apr. 6, 2021; Publication date unknown but prior to filing of present application.

(Continued)

*Primary Examiner* — James Wu
*Assistant Examiner* — Christopher L Augustin
(74) *Attorney, Agent, or Firm* — Philip H. Burrus, IV

(57) ABSTRACT

An electronic device includes one or more sensors, one or more processors operable with the one or more sensors, one or more extendable gripping feet, and an actuation engine operable to extend and retract the one or more extendable gripping feet. The one or more sensors detect a condition of the electronic device and, in response to the one or more sensors detecting the condition, the one or more processors cause the actuation engine to transition the one or more extendable gripping feet from a retracted position to an extended position where the one or more extendable gripping feet extend distally away from the electronic device.

20 Claims, 6 Drawing Sheets

(56) References Cited

U.S. PATENT DOCUMENTS

| | | | |
|---|---|---|---|
| 11,196,852 B2* | 12/2021 | Li | H04M 1/185 |
| 2011/0194230 A1* | 8/2011 | Hart | H04M 1/185 |
| | | | 361/437 |
| 2012/0062483 A1* | 3/2012 | Ciesla | G06F 3/041 |
| | | | 345/173 |
| 2015/0001368 A1* | 1/2015 | Sprenger | G06F 1/166 |
| | | | 248/550 |
| 2017/0102746 A1* | 4/2017 | Knepper | G06F 1/206 |
| 2017/0200881 A1* | 7/2017 | Gdala | G06F 3/016 |
| 2018/0295731 A1* | 10/2018 | Burdoucci | H04M 1/00 |

OTHER PUBLICATIONS

Ankit, et al., "Surface Texture Change on-demand and Microfluidic Devices Based on Thickness Mode Actuation of Dielectric Elastomer Actuators", Publisehd Apr. 17, 2017; https://www.spiedigitallibrary.org/conference-proceedings-of-spie/10163/1/Surface-texture-change-on-demand-and-microfluidic-devices-based-on/10.1117/12.2260300.short?SSO=1.

Das, Sumi , "A Keyboard that Rises Up From Flat Touch Screends", Published Feb. 13, 2013; https://www.cnet.com/tech/mobile/a-keyboard-that-rises-up-from-flat-touch-screens/.

Emmino, Nicolette , "Strides in Soft Robotics", Electronics 360; https://electronics360.globalspec.com/article/7242/strides-in-soft-robotics; Published Aug. 30, 2016.

* cited by examiner

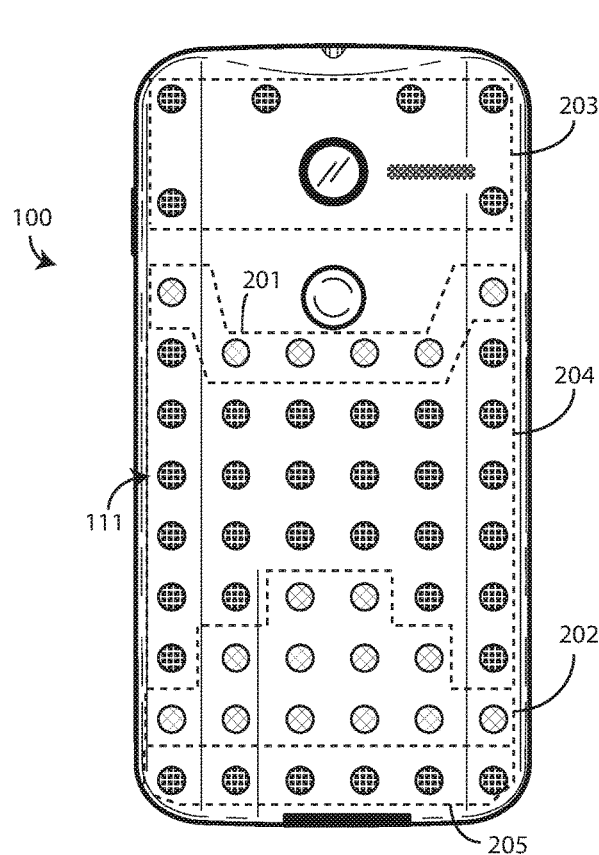
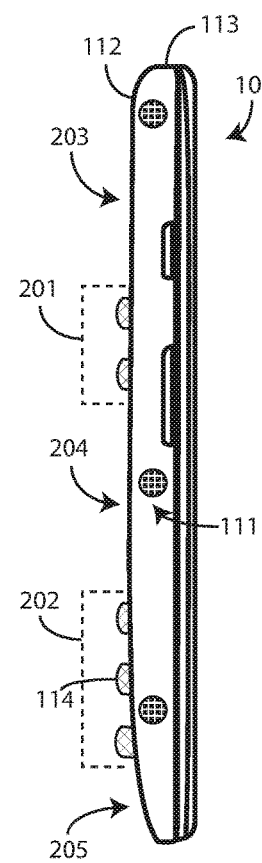
FIG. 2
FIG. 3
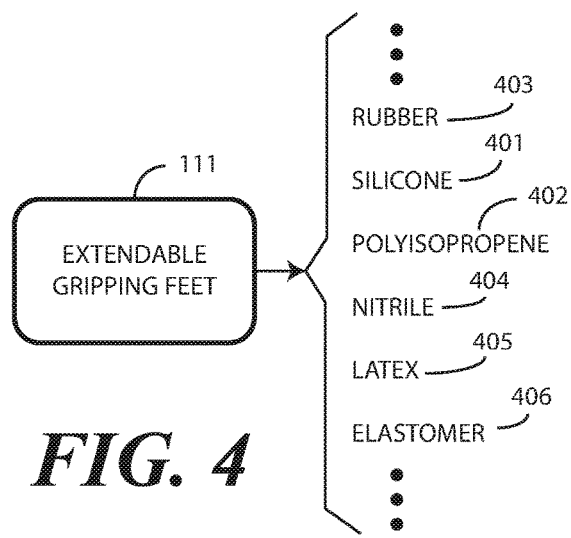
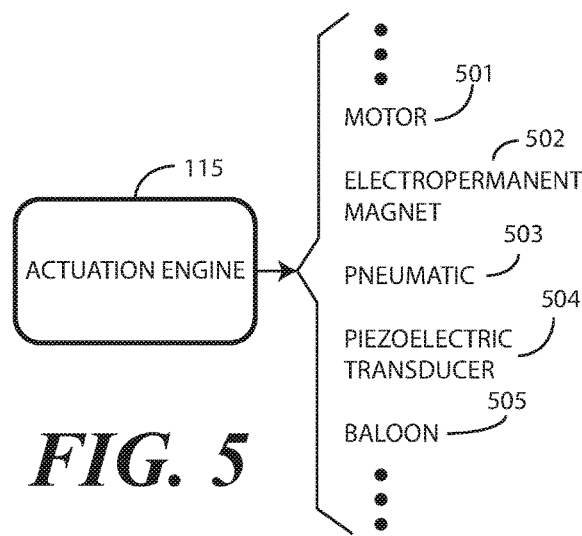
FIG. 4
FIG. 5

ELECTRONIC DEVICE WITH EXTENDABLE GRIPPING FEET AND CORRESPONDING METHODS

BACKGROUND

Technical Field

This disclosure relates generally to devices, and more particularly to electronic devices.

Background Art

Portable electronic devices are continually becoming more advanced. Nothing demonstrates this more than the advancement of the mobile phone. Modern smartphones have more computing power than did the desktop computers of only a few years ago. In addition to making voice calls, users of smartphones, tablet computers, and other portable electronic devices use the same to maintain calendars, photo libraries, audio libraries, financial information, health information, and even to surf the Internet.

This advanced computing power comes at a cost. In particular, smartphones and other advanced electronic devices can be quite expensive. Consequently, many people purchase cases and covers that encapsulate the device. While effective at providing some protection, cases can be problematic in that they can get stuck in pockets and are frequently difficult to remove. It would be advantageous to have an improved electronic device with protective features.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present disclosure.

FIG. 2 illustrates one explanatory electronic device in accordance with one or more embodiments of the disclosure having one or more extendable gripping feet extended distally away from the electronic device.

FIG. 3 illustrates another view of the explanatory electronic device of FIG. 2.

FIG. 4 illustrates one or more explanatory examples of extendable gripping feet in accordance with one or more embodiments of the disclosure.

FIG. 5 illustrates one or more explanatory examples of actuation engines in accordance with one or more embodiments of the disclosure.

Figure 1:
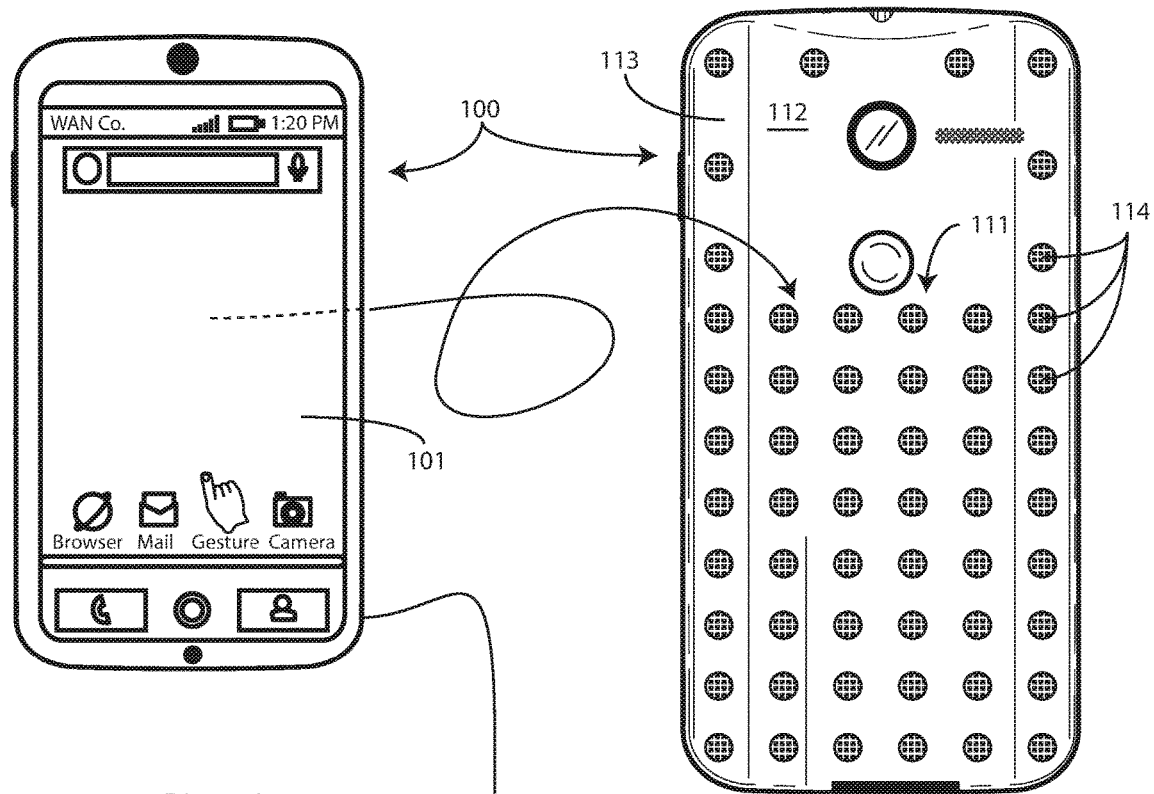
FIG. 1 illustrates one explanatory electronic device in accordance with one or more embodiments of the disclosure.
Figure 1:
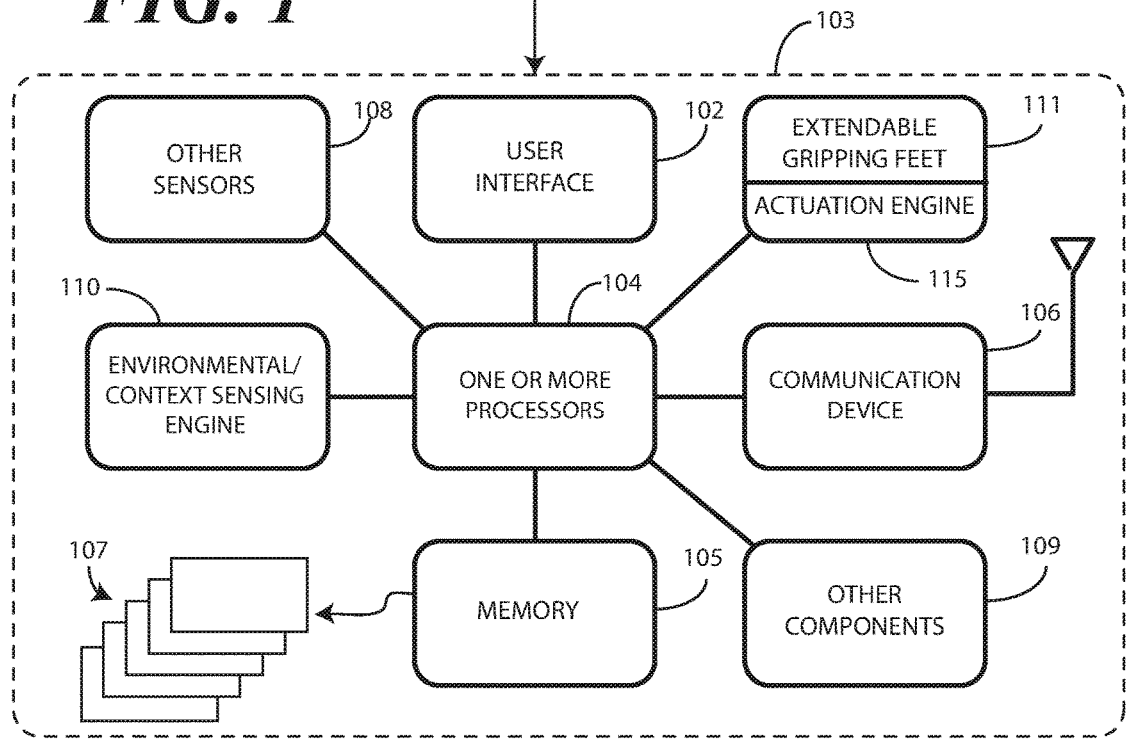

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Before describing in detail embodiments that are in accordance with the present disclosure, it should be observed that the embodiments reside primarily in combinations of method steps and apparatus components related to one or more processors causing an actuation engine to transition one or more extendable gripping feet from a retracted position to an extended position when one or more sensors of the electronic device detect a predefined condition of the electronic device. Any process descriptions or blocks in flow charts should be understood as representing modules, segments, or portions of code that include one or more executable instructions for implementing specific logical functions or steps in the process. Alternate implementations are included, and it will be clear that functions may be executed out of order from that shown or discussed, including substantially concurrently or in reverse order, depending on the functionality involved. Accordingly, the apparatus components and method steps have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

Embodiments of the disclosure do not recite the implementation of any commonplace business method aimed at processing business information, nor do they apply a known business process to the particular technological environment of the Internet. Moreover, embodiments of the disclosure do not create or alter contractual relations using generic computer functions and conventional network operations. Quite to the contrary, embodiments of the disclosure employ methods that, when applied to electronic device and/or user interface technology, improve the functioning of the electronic device itself by and improving the overall user experience to overcome problems specifically arising in the realm of the technology associated with electronic device user interaction.

It will be appreciated that embodiments of the disclosure described herein may be comprised of one or more conventional processors and unique stored program instructions that control the one or more processors to implement, in conjunction with certain non-processor circuits, some, most, or all of the functions of causing, in response to one or more sensors detecting a condition, an actuation engine to transition one or more extendable gripping feet from a retracted state to an extended state as described herein. The non-processor circuits may include, but are not limited to, a radio receiver, a radio transmitter, signal drivers, clock circuits, power source circuits, and user input devices. As such, these functions may be interpreted as steps of a method to perform the transitioning of one or more extendable gripping feet from a retracted position or state to an extended position or state, or vice versa. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ASICs with minimal experimentation.

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions.

As used herein, components may be "operatively coupled" when information can be sent between such components, even though there may be one or more intermediate or intervening components between, or along the connection path. The terms "substantially", "essentially", "approximately", "about" or any other version thereof, are defined as being close to as understood by one of ordinary skill in the art, and in one non-limiting embodiment the term is defined to be within ten percent, in another embodiment within five percent, in another embodiment within one percent and in another embodiment within one-half percent. The term "coupled" as used herein is defined as connected, although not necessarily directly and not necessarily mechanically. Also, reference designators shown herein in parenthesis indicate components shown in a figure other than the one in discussion. For example, talking about a device (10) while discussing figure A would refer to an element, 10, shown in figure other than figure A.

In addition to covering portable electronic devices with cases and covers to protect the device itself, embodiments of the disclosure contemplate that many people actually apply "grippable" cases or covers, such as those made from silicone, to their electronic devices to prevent them from slipping out of their hands. The problem with this attempt to make the device more "grippy" is that such cases are static and frequently do not resolve many of the potential surface or grip related issues dynamically. Instead, the covers and cases easily get stuck in pockets and bags, are difficult to remove, collect debris and dirt, and are often aesthetically unpleasant. Moreover, to provide any gripability, these cases and covers must be relatively thick, which makes them unnecessarily "grab" unintended objects or surfaces when the electronic device is being moved, shifted, or stowed.

Advantageously, embodiments of the disclosure provide electronic devices—and even covers for electronic devices—that include one or more extendable gripping feet that can transition from a retracted position to an extended position where the one or more extendable gripping feet extend distally away from the electronic device in response to one or more sensors detecting a condition of the electronic device. In one or more embodiments, when the extendable gripping feet are in the retracted position the distal ends of the extendable gripping feet sit flush with either surfaces of the electronic device or, if configured in a cover, with surfaces of the cover. When the one or more sensors detect a predefined condition, one or more processors of the electronic device or cover then cause an actuation engine to extend the extendable gripping feet from the retracted position to the extended position where the extendable gripping feet extend distally away from the surface of the electronic device or cover. In one or more embodiments, actuation engine is configured to selectively adjust the amount of extension that each extendable gripping foot of the extendable gripping feet extends from this surface depending upon an environment in which the electronic device is positioned or a surface with which the electronic device is in contact.

In one or more embodiments, an electronic device comprises one or more sensors. The electronic device also includes one or more processors operable with the one or more sensors. One or more extendable gripping feet are then operable with an actuation engine. The actuation engine is operable to extend and retract the one or more extendable gripping feet.

In one or more embodiments, the one or more sensors of the electronic device detect a condition of the electronic device. Examples of such a condition include an identified surface type, an identified surface shape, an identified surface configuration, velocity or movement of the electronic device, active usage of the electronic device, stowing actions or states, user interactions or configurations, and even surface conditions, such as when a surface is wet. Other examples of conditions that the one or more sensors can detect will be described below. Still others will be obvious to those of ordinary skill in the art having the benefit of this disclosure.

In one or more embodiments, in response to the one or more sensors detecting the condition of the electronic device, the one or more processors cause the actuation engine to transition the one or more extendable gripping feet from the retracted position to the extended position where the one or more extendable gripping feet extend distally away from the electronic device. In one or more embodiments, end surfaces of the one or more extendable gripping feet sit flush with the device housing when the extendable gripping feet are in the retracted position. By contrast, the one or more extendable gripping feet situate distally away from the device housing in the extended position.

The one or more sensors can identify the condition in a variety of ways. Illustrating by example, the one or more sensors can include an imager or near-field communication circuit that may acquire characteristics of a surface. In one or more embodiments, these acquired characteristics can be compared with a database of surfaces and associated characteristics stored in a memory of the electronic device to make a determination of what type of surface, what shape of surface, what material or surface, or what condition of surface (e.g., wet or dry, waxed or high-friction, etc.) is abutting the surfaces of the device housing of the electronic device. In other embodiments, a surface may be measured using an image capture device that is activated during device movement.

In still other embodiments, a condition may be determined from an identified location. For instance, if one or more sensors of the electronic device determine that the electronic device is in the same place at a particular time of day, such as a person's home or car, and so forth, the one or more sensors may make a probabilistic guess regarding the condition of the electronic device that informs the one or more processors regarding whether the actuation engine should transition the one or more extendable gripping feet from the retracted position to the extended position.

In still other embodiments, the one or more sensors may detect a condition directly. A moisture sensor, for example, may detect directly that a surface is wet. To prevent the electronic device from sliding, or alternatively to lift the electronic device out of the moisture, the one or more processors may cause the actuation engine to transition the one or more extendable gripping feet from the retracted position to the extended position.

In still other embodiments, the one or more sensors may detect movement toward a surface or an in-use state to detect the condition. For instance, an accelerometer and/or image capture device may be used to determine movement of the electronic device and trajectory. The image capture device can be used to detect and identify—through image recognition—a surface approaching the electronic device so that the one or more processors can cause the actuation engine to transition the one or more extendable gripping feet to the retracted position, the extended position, or somewhere in between, before the electronic device makes contact with the surface. Usage of the electronic device can be detected in many ways as the condition, including by way of the image capture device, which applications are operating on the electronic device, and so forth.

In one or more embodiments, only some of the one or more extendable gripping feet are transitioned from the retracted position to the extended position in response to the one or more sensors detecting a predefined condition. For instance, depending upon the surface characteristics and device dimensions, in one or more embodiments the one or more processors will cause the actuation engine to transition some of the extendable gripping feet to extended positions while others remain in the retracted position so that the contour defined by the end surfaces of the extendable gripping feet match the surface contours of the surface. This mapping can be a function of other factors, including even motion. If the one or more sensors detect that the electronic device is in a vehicle, they may cause the actuation engine to transition some of the extendable gripping feet to extended positions while others remain in the retracted position so that the contour defined by the end surfaces of the extendable gripping feet match the surface contours of the interior of a vehicle, and so forth.

The one or more sensors may also detect—or estimate—a coefficient of friction of the surface so that the one or more processors can selectively cause the actuation engine to transition some of the extendable gripping feet from the retracted position to the extended position. If, for example, the electronic device is sitting on the foldout tray of an airplane, which is typically quite slick, the one or more processors may cause the actuation engine to transition all of the extendable gripping feet situated on a surface abutting the foldout tray. By contrast, if the electronic device is situated on something covered with shag carpet, only a few of the extendable gripping feet may be extended, as the carpet has a high coefficient of friction.

The actuation engine can take many different forms. In one or more embodiments, the actuation engine comprises a motor. In other embodiments, the actuation engine is a pneumatic engine that can transition the extendable gripping feet between the retracted position and the extended position. In other embodiments, the actuation engine is a piezoelectric transducer. In still other embodiments, the actuation engine is an inflatable device using a gas or fluid hydraulic mechanism to transition the extendable gripping feet between the retracted position and the extended position. In one particular embodiment, the actuation engine comprises an electropermanent magnet. Electropermanent magnets are well-suited for use in embodiments of the disclosure because once the extendable gripping feet have been transitioned to the retracted position or the extended position, the electropermanent magnet does not need to continue drawing current to keep them in the desired position. This helps to reduce battery drain and extend device operation between recharging cycles.

Embodiments of the disclosure can be integrated into an electronic device itself. Alternatively, they can be incorporated into a case in other embodiments. In one or more embodiments a case, which can be coupled to an electronic device, carries one or more extendable gripping feet. When the actuation engine transitions the extendable gripping feet to the extended position, the end surfaces of the extendable gripping feet situate distally away from the case. By contrast, when the actuation engine transitions the extendable gripping feet to the retracted position, in one or more embodiments the end surfaces sit flush with the exterior surface of the case. Of course, in any of the embodiments the actuation engine may optionally be able to transition the end surfaces of the extendable gripping feet to a location between the retracted position and the extended position as well.

Turning now to FIG. 1, illustrated therein is one explanatory electronic device 100 configured in accordance with one or more embodiments of the disclosure. The electronic device 100 of FIG. 1 is a portable electronic device. For illustrative purposes, the electronic device 100 is shown as a smartphone. However, the electronic device 100 could be any number of other devices as well, including tablet computers, desktop computers, notebook computers, and so forth. Still other types of conferencing system terminal devices can be configured in accordance with one or more embodiments of the disclosure as will be readily appreciated by those of ordinary skill in the art having the benefit of this disclosure.

This illustrative electronic device 100 includes a display 101, which may optionally be touch-sensitive. In one embodiment where the display 101 is touch-sensitive, the display 101 can serve as a primary user interface 102 of the electronic device 100. Users can deliver user input to the display 101 of such an embodiment by delivering touch input from a finger, stylus, or other objects disposed proximately with the display 101.

In one embodiment, the display 101 is configured as an active matrix organic light emitting diode (AMOLED) display. However, it should be noted that other types of displays, including liquid crystal displays, would be obvious to those of ordinary skill in the art having the benefit of this disclosure. Where the electronic device 100 is configured with a keyboard and/or mouse, such as when the electronic device 100 is configured as a computer, the keyboard and/or mouse can serve as the primary user interface 102.

A block diagram schematic 103 of the electronic device 100 is also shown in FIG. 1. The block diagram schematic 103 can be configured as a printed circuit board assembly disposed within the device housing of the electronic device 100. Various components can be electrically coupled together by conductors or a bus disposed along one or more printed circuit boards.

In one or more embodiments, the electronic device 100 includes one or more processors 104. In one embodiment, the one or more processors 104 can include an application processor and, optionally, one or more auxiliary processors.

One or both of the application processor or the auxiliary processor(s) can include one or more processors. One or both of the application processor or the auxiliary processor(s) can be a microprocessor, a group of processing components, one or more ASICs, programmable logic, or other type of processing device.

The application processor and the auxiliary processor(s) can be operable with the various components of the electronic device 100. Each of the application processor and the auxiliary processor(s) can be configured to process and execute executable software code to perform the various functions of the electronic device 100. A storage device, such as memory 105, can optionally store the executable software code used by the one or more processors 104 during operation.

The electronic device 100 also includes a communication device 106 that can be configured for wired or wireless communication with one or more other devices or networks. The networks can include a wide area network, a local area network, and/or personal area network. The communication device 106 may also utilize wireless technology for communication, such as, but are not limited to, peer-to-peer or ad hoc communications such as HomeRF, near-field communications (NFC), Bluetooth and IEEE 802.11, and other forms of wireless communication such as infrared technology. The communication device 106 can include wireless communication circuitry, one of a receiver, a transmitter, or transceiver, and one or more antennas.

In one embodiment, the one or more processors 104 can be responsible for performing the primary functions of the electronic device 100. For example, in one embodiment the one or more processors 104 comprise one or more circuits operable with one or more user interface devices, which can include the display 101, to engage in audio or video conferences by transmitting, receiving, and presenting images, video, or other presentation information. The executable software code used by the one or more processors 104 can be configured as one or more modules that are operable with the one or more processors 104. Such modules can store instructions, control algorithms, logic steps, and so forth.

In one embodiment, the one or more processors 104 are responsible for running the operating system environment of the electronic device 100. The operating system environment can include a kernel and one or more drivers, and an application service layer, and an application layer. The operating system environment can be configured as executable code operating on one or more processors or control circuits of the electronic device 100. The application layer can be responsible for executing application service modules. The application service modules may support one or more applications or "apps." The applications of the application layer can be configured as clients of the application service layer to communicate with services through application program interfaces (APIs), messages, events, or other inter-process communication interfaces. Where auxiliary processors are used, they can be used to execute input/output functions, actuate user feedback devices, and so forth.

In one embodiment, the one or more processors 104 may generate commands or execute control operations based upon user input received at the user interface 102. Moreover, the one or more processors 104 may process the received information alone or in combination with other data, such as the information stored in the memory 105.

The electronic device 100 can include one or more sensors 108. The one or more sensors 108 may include a microphone, an earpiece speaker, and/or a second loudspeaker. The one or more other sensors 108 may also include touch actuator selection sensors, proximity sensors, a touch pad sensor, a touch screen sensor, a capacitive touch sensor, and one or more switches. Touch sensors may used to indicate whether any of the user actuation targets present on the display 101, including the audio difficulties user actuation targets described above, are being actuated. The other sensors 108 can also include audio sensors and video sensors (such as a camera).

Figure 7:
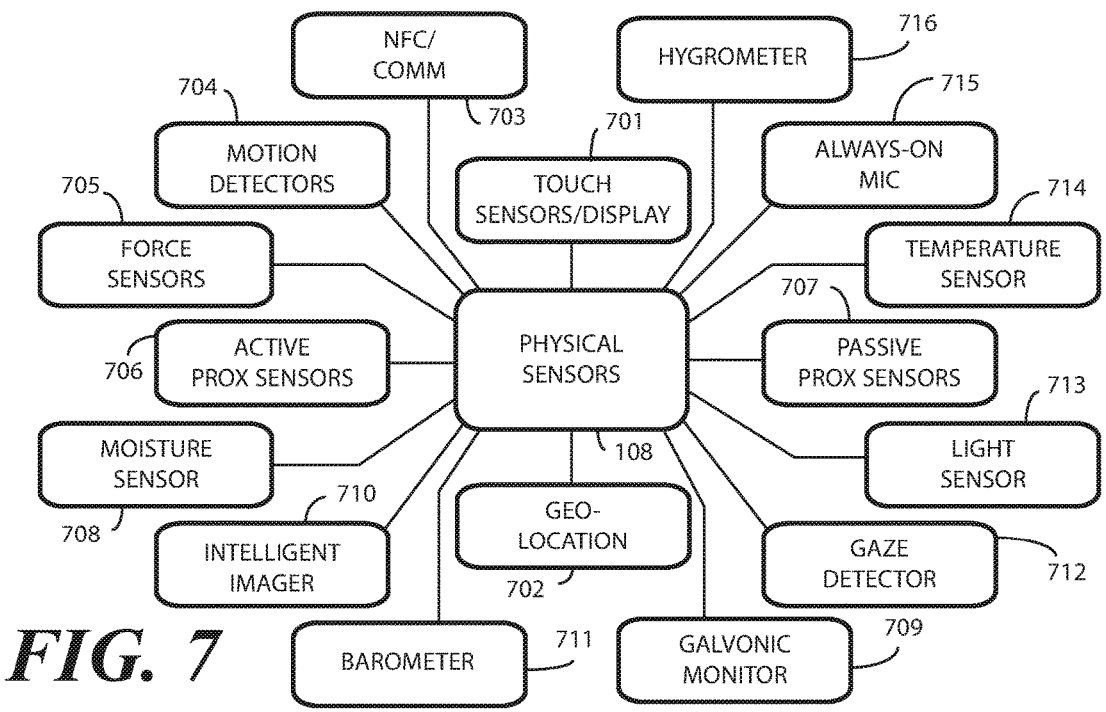
FIG. 7 illustrates one or more explanatory examples of sensors suitable for use on an electronic device in accordance with one or more embodiments of the disclosure.

Turning briefly to FIG. 7, illustrated therein are some of the various sensors that can be included with the one or more sensors 108 of the electronic device. In one or more embodiments, the one or more sensors 108 comprise physical sensors configured to sense or determine physical parameters indicative of conditions in an environment about an electronic device (100). FIG. 7 illustrates several examples of such physical sensors. It should be noted that those shown in FIG. 7 are not comprehensive, as others will be obvious to those of ordinary skill in the art having the benefit of this disclosure. Additionally, it should be noted that the various physical sensors shown in FIG. 7 could be used alone or in combination. Accordingly, many electronic devices will employ only subsets of the one or more sensors 108 shown in FIG. 7, with the particular subset defined by device application.

A first example of a physical sensor is a touch sensor 701. The touch sensor 701 can include a capacitive touch sensor, an infrared touch sensor, resistive touch sensors, or another touch-sensitive technology. Capacitive touch-sensitive devices include a plurality of capacitive sensors, e.g., electrodes, which are disposed along a substrate. Each capacitive sensor is configured, in conjunction with associated control circuitry, e.g., the one or more processors (104), to detect an object in close proximity with—or touching—the surface of the display (101) or the housing of an electronic device (100) by establishing electric field lines between pairs of capacitive sensors and then detecting perturbations of those field lines.

The electric field lines can be established in accordance with a periodic waveform, such as a square wave, sine wave, triangle wave, or other periodic waveform that is emitted by one sensor and detected by another. The capacitive sensors can be formed, for example, by disposing indium tin oxide patterned as electrodes on the substrate. Indium tin oxide is useful for such systems because it is transparent and conductive. Further, it is capable of being deposited in thin layers by way of a printing process. The capacitive sensors may also be deposited on the substrate by electron beam evaporation, physical vapor deposition, or other various sputter deposition techniques.

Another example of a sensor is a geo-locator that serves as a location detector 702. In one embodiment, location detector 702 is able to determine location data from a constellation of one or more earth orbiting satellites, or from a network of terrestrial base stations to determine an approximate location. Examples of satellite positioning systems suitable for use with embodiments of the present invention include, among others, the Navigation System with Time and Range (NAV STAR) Global Positioning Systems (GPS) in the United States of America, the Global Orbiting Navigation System (GLONASS) in Russia, and other similar satellite positioning systems. The satellite positioning systems based location fixes of the location detector 702 autonomously or with assistance from terrestrial base stations, for example those associated with a cellular communication network or other ground based network, or as part of a Differential Global Positioning System (DGPS), as is well known by those having ordinary skill in the art. The location detector 702 may also be able to determine location by locating or triangulating terrestrial base stations of a traditional cellular network, or from other local area networks, such as Wi-Fi networks.

Another example of a sensor is a near field communication circuit 703. The near field communication circuit 703 can be included for communication with local area networks to receive information regarding the context of the environment in which an electronic device (100) is located. If, for example, a user is at a museum, they may be standing near an exhibit that can be identified with near field communication. This identification can indicate that the electronic device (100) is both indoors and at a museum. Alternatively, the near field communication circuit 703 can be used to receive contextual information from kiosks and other electronic devices. The near field communication circuit 703 can also be used to obtain image or other data from social media networks. Examples of suitable near field communication circuits include Bluetooth communication circuits, IEEE 801.11 communication circuits, infrared communication circuits, magnetic field modulation circuits, and Wi-Fi circuits.

Another example of a sensor is the motion detector 704. Illustrating by example, an accelerometer, gyroscopes, or other device can be used as a motion detector 704 in an electronic device (100). Using an accelerometer as an example, an accelerometer can be included to detect motion of the electronic device (100). Additionally, the accelerometer can be used to sense some of the gestures of the user, such as one talking with their hands, running, or walking.

The motion detector 704 can also be used to determine the spatial orientation of an electronic device (100) as well in three-dimensional space by detecting a gravitational direction. In addition to, or instead of, an accelerometer, an electronic compass can be included to detect the spatial orientation of the electronic device (100) relative to the earth's magnetic field. Similarly, one or more gyroscopes can be included to detect rotational motion of the electronic device.

Another example of a sensor is a force sensor 705. The force sensor can take various forms. For example, in one embodiment, the force sensor comprises resistive switches or a force switch array configured to detect contact with either the display (101) or the housing of an electronic device (100). The array of resistive switches can function as a force-sensing layer, in that when contact is made with either the surface of the display (101) or the housing of the electronic device (100), changes in impedance of any of the switches may be detected. The array of switches may be any of resistance sensing switches, membrane switches, force-sensing switches such as piezoelectric switches, or other equivalent types of technology. In another embodiment, the force sensor can be capacitive. In yet another embodiment, piezoelectric sensors can be configured to sense force as well. For example, where coupled with the lens of the display (101), the piezoelectric sensors can be configured to detect an amount of displacement of the lens to determine force. The piezoelectric sensors can also be configured to determine force of contact against the housing of the electronic device (100) rather than the display (101).

Another example of a sensor is a proximity sensor. The proximity sensors fall in to one of two camps: active proximity sensors and "passive" proximity sensors. These are shown as proximity detector components 706 and proximity sensor components 707 in FIG. 7. Either the proximity detector components 706 or the proximity sensor components 707 can be generally used for detecting objects being situated against, or proximately located with, surfaces of the electronic device (100).

As used herein, a "proximity sensor component" comprises a signal receiver only that does not include a corresponding transmitter to emit signals for reflection off an object to the signal receiver. A signal receiver only can be used due to the fact that a user's body or other heat generating object external to device, such as a wearable electronic device worn by user, serves as the transmitter. Illustrating by example, in one or more embodiments the proximity sensor components 707 comprise a signal receiver to receive signals from objects external to the housing of an electronic device. In one embodiment, the signal receiver is an infrared signal receiver to receive an infrared emission from an object such as a human being when the human is proximately located with the electronic device.

Proximity sensor components 707 are sometimes referred to as a "passive IR system" due to the fact that the person is the active transmitter. Accordingly, the proximity sensor component 707 requires no transmitter since objects disposed external to the housing deliver emissions that are received by the infrared receiver. As no transmitter is required, each proximity sensor component 707 can operate at a very low power level.

In one embodiment, the signal receiver of each proximity sensor component 707 can operate at various sensitivity levels so as to cause the at least one proximity sensor component 707 to be operable to receive the infrared emissions from different distances. For example, the one or more processors (104) can cause each proximity sensor component 707 to operate at a first "effective" sensitivity so as to receive infrared emissions from a first distance. Similarly, the one or more processors (104) can cause each proximity sensor component 707 to operate at a second sensitivity, which is less than the first sensitivity, so as to receive infrared emissions from a second distance, which is less than the first distance. The sensitivity change can be effected by causing the one or more processors (104) to interpret readings from the proximity sensor component 707 differently.

By contrast, proximity detector components 706 include a signal emitter and a corresponding signal receiver. While each proximity detector component 706 can be any one of various types of proximity sensors, such as but not limited to, capacitive, magnetic, inductive, optical/photoelectric, imager, laser, acoustic/sonic, radar-based, Doppler-based, thermal, and radiation-based proximity sensors, in one or more embodiments the proximity detector components 706 comprise infrared transmitters and receivers.

In one or more embodiments, each proximity detector component 706 can be an infrared proximity sensor set that uses a signal emitter that transmits a beam of infrared light that reflects from a nearby object and is received by a corresponding signal receiver. Proximity detector components 706 can be used, for example, to compute the distance to any nearby object from characteristics associated with the reflected signals. These distances can be used to determine surface shapes. The reflected signals are detected by the corresponding signal receiver, which may be an infrared photodiode used to detect reflected light emitting diode (LED) light, respond to modulated infrared signals, and/or perform triangulation of received infrared signals.

Another example of a sensor is a moisture detector 708. A moisture detector 708 can be configured to detect the amount of moisture on or about the display (101) or the housing of the electronic device (100). This can indicate various forms of context. Sometimes, it can indicate that the electronic device (100) is situated upon a surface that is wet due to the fact that moisture is present. The moisture detector 708 can be realized in the form of an impedance sensor that measures impedance between electrodes. As moisture can be due to external conditions, e.g., rain, spilled drinks, or user conditions such as perspiration, the moisture detector 708 can function in tandem with ion sensitive field effect transistors (ISFETS) configured to measure pH or amounts of sodium hydroxide (NaOH) in the moisture or a galvanic sensor 709 to determine not only the amount of moisture, but whether the moisture is due to external factors, perspiration, or combinations thereof.

An intelligent imager 710 can be configured to capture an image of an object and determine whether the object matches predetermined criteria. For example, the intelligent imager 710 operate as an identification module configured with optical recognition such as include image recognition, character recognition, visual recognition, facial recognition, color recognition, shape recognition and the like. Advantageously, the intelligent imager 710 can be used as a condition recognition device to determine information such as what type of surface the electronic device (100) is situated upon, what type of condition the electronic device (100) is experiencing, e.g., being held, stowed in a pocket or bag, or otherwise, and so forth.

Illustrating by example, in one embodiment when the one or more proximity sensor components 707 detect an approaching surface, the intelligent imager 710 can capture a photograph of that surface. The intelligent imager 710 can then compare the image to a reference file stored in memory (105), to confirm beyond a threshold probability that the surface is manufactured from a particular material, has a particular coefficient of friction, has a particular shape, and so forth. Beneficially, optical recognition allows the one or more processors (104) to cause an actuation engine to transition end surfaces of one or more extendable gripping feet to distances—which can be in any pattern—to match an abutting surface, hand, or container such as a pocket.

In addition to capturing photographs, the intelligent imager 710 can function in other ways as well. For example, in some embodiments the intelligent imager 710 can capture multiple successive pictures to capture even more information. Alternatively, the intelligent imager 710 can capture or video frames, with or without accompanying metadata such as motion vectors. This additional information captured by the intelligent imager 710 can be used to detect the condition of the electronic device (100), be it surface characteristics of a surface abutting the electronic device, surface measurements of the surface, frictional coefficients of the surface, or what type or amount of liquid is present on the surface. Other features identifiable by the intelligent imager 710 will be obvious to those of ordinary skill in the art having the benefit of this disclosure.

A barometer 711 can sense changes in air pressure due to environmental and/or weather changes. In one embodiment, the barometer 711 includes a cantilevered mechanism made from a piezoelectric material and disposed within a chamber. The cantilevered mechanism functions as a pressure sensitive valve, bending as the pressure differential between the chamber and the environment changes. Deflection of the cantilever ceases when the pressure differential between the chamber and the environment is zero. As the cantilevered material is piezoelectric, deflection of the material can be measured with an electrical current.

A gaze detector 712 can comprise sensors for detecting the user's gaze point. The gaze detector 712 can optionally include sensors for detecting the alignment of a user's head in three-dimensional space. The gaze detector 712 can further be configured to detect a gaze cone corresponding to the detected gaze direction, which is a field of view within which the user may easily see without diverting their eyes or head from the detected gaze direction.

A light sensor 713 can detect changes in optical intensity, color, light, or shadow in the environment of an electronic device (100). This can be used to make inferences about context such as whether the electronic device (100) is in open air or is stowed within a container such as a pocket, backpack, or purse. An infrared sensor can be used in conjunction with, or in place of, the light sensor 713. The infrared sensor can be configured to detect thermal emissions from an environment about an electronic device. Similarly, a temperature sensor 714 can be configured to monitor temperature about an electronic device (100).

The one or more sensors 108 can also include an audio capture device 715. In one embodiment, the audio capture device 715 includes one or more microphones to receive acoustic input. While the one or more microphones can be used to sense voice input, voice commands, and other audio input, in some embodiments they can be used as environmental sensors to sense environmental sounds such as the crumpling sound of fabric when the electronic device (100) is stowed within a pocket.

In one embodiment, the one or more microphones include a single microphone. However, in other embodiments, the one or more microphones can include two or more microphones. Where multiple microphones are included, they can be used for selective beam steering to, for instance, determine from which direction a sound emanated. Illustrating by example, a first microphone can be located on a first side of the electronic device (100) for receiving audio input from a first direction, while a second microphone can be placed on a second side of the electronic device (100) for receiving audio input from a second direction. The one or more processors (104) can then select between the first microphone and the second microphone to beam steer audio reception. Alternatively, the one or more processors (104) can process and combine the signals from two or more microphones to perform beam steering.

In one embodiment, the audio capture device 715 comprises an "always ON" audio capture device. As such, the audio capture device 715 is able to capture audio input at any time that an electronic device (100) is operational.

One further example of the one or more sensors 108 is a hygrometer 716. The hygrometer 716 can be used to detect humidity, which can indicate that a user is outdoors or is perspiring. As noted above, the illustrative one or more sensors 108 of FIG. 7 are not comprehensive. Numerous others could be added. For example, a wind-speed monitor could be included to detect wind. Accordingly, the one or more sensors 108 of FIG. 7 are illustrative only, as numerous others will be obvious to those of ordinary skill in the art having the benefit of this disclosure.

Turning now back to FIG. 1, other components 109 operable with the one or more processors 104 can include output components such as video outputs, audio outputs, and/or mechanical outputs. Examples of output components include audio outputs such as speaker port, earpiece speaker, or other alarms and/or buzzers and/or a mechanical output component such as vibrating or motion-based mechanisms. Still other components will be obvious to those of ordinary skill in the art having the benefit of this disclosure.

The other components 109 can also include an audio input/processor. The audio input/processor can include hardware, executable code, and speech monitor executable code in one embodiment. The audio input/processor can include, stored in memory 105, basic speech models, trained speech models, or other modules that are used by the audio input/processor to receive and identify voice commands that are received with audio input captured by an audio input/processor, one example of which is a microphone of the one or more sensors 108. In one embodiment, the audio input/processor can include a voice recognition engine. Regardless of the specific implementation utilized in the various embodiments, the audio input/processor can access various speech models to identify speech commands in one or more embodiments.

An environmental and/or context sensing engine 110 can be operable with the one or more sensors 108 to detect a condition of the electronic device 100. The environmental and/or context sensing engine 110 can be used to detect, infer, capture, and otherwise determine conditions about the electronic device 100. In one embodiment, environmental and/or context sensing engine 110 determines, from the one or more sensors 108, assessed contexts and frameworks using adjustable algorithms of context assessment employing information, data, and events. These assessments may be learned through repetitive data analysis. Alternatively, a user may employ the user interface 102 to enter various parameters, constructs, rules, and/or paradigms that instruct or otherwise guide the environmental and/or context sensing engine 110 in detecting conditions of the electronic device 100 and other contextual information. The environmental and/or context sensing engine 110 can comprise an artificial neural network or other similar technology in one or more embodiments.

In one or more embodiments, the environmental and/or context sensing engine 110 is operable with the one or more processors 104. In some embodiments, the one or more processors 104 can control the environmental and/or context sensing engine 110. In other embodiments, the environmental and/or context sensing engine 110 can operate independently, delivering information gleaned from detecting conditions of the electronic device 100 and other contextual information to the one or more processors 104. The environmental and/or context sensing engine 110 can receive data from one or more sensors 108. In one or more embodiments, the one or more processors 104 are configured to perform the operations of the environmental and/or context sensing engine 110.

In the illustrative embodiment of FIG. 1, the electronic device 100 includes one or more extendable gripping feet 111. The extendable gripping feet 111 are shown illustratively in FIG. 1 as being disposed along a rear surface 112 of a device housing 113 of the electronic device 100. The extendable gripping feet 111 comprise cylindrical elements having end surfaces 114 with a high coefficient of friction that, when extended to an extended position, will cause the electronic device 100 to resist sliding against surfaces.

The extendable gripping feet 111 can be manufactured from various materials. Turning briefly to FIG. 4, illustrated therein are some illustrative examples of materials that can be used to manufacture the extendable gripping feet 111. Others will be obvious to those of ordinary skill in the art having the benefit of this disclosure.

In one or more embodiments, the extendable gripping feet 111 are semi-rigid elements. In one or more embodiments, the end surfaces 114 of the extendable gripping feet 111 have a higher coefficient of friction than do the surfaces of the device housing 113 of the electronic device 100. This allows the overall electronic device to grip objects when the end surfaces 114 of the extendable gripping feet 111 are extended to situate distally away from the device housing 113 in the extended position, while still allowing the overall electronic device 100 to feel smooth when the extendable gripping feet 111 are in the retracted position.

For example, in one or more embodiments the extendable gripping feet 111 are each manufactured from silicone 401. The silicone 401 can be translucent, or can be of a predefined color. For instance, translucent extendable gripping feet 111 can be backlit with various colors—or white light—so as to serve as an illumination source when either in the retracted position or the extended position. In other embodiments, the extendable gripping feet 111 can be manufactured in a predefined color. The extendable gripping feet 111 may be colored so as to match the rear surface (112) of the device housing (113) of the electronic device (100), for example.

Silicone 401 is an advantageous material for constructing the extendable gripping feet 111 for a variety of reasons. First, silicone 401 is semi-rigid. Second, it has a high frictional coefficient. Third, it is semi-compressible. Fourth, it can be made to be translucent, thereby serving as a light pipe. Fifth, it can be colored in any of a variety of colors. Sixth, it can provide vibration isolation from supporting surfaces to enhance acoustic performance of microphones, loudspeakers, or other acoustic devices of the electronic device (100) when the extendable gripping feet 111 are in the extended position. Additionally, the extension of the extendable gripping feet 111 to the extended position allows the extendable gripping feet 111 to serve as a stand on a supporting surface that both prevents the electronic device (100) from sliding and that supports the electronic device (100) above the supportive surface such that the exterior surface from which the extendable gripping feet 111 extend, e.g., the rear surface (112) of the device housing (113) of the electronic device (100), and the supporting surface do not contact each other.

While silicone 401 is one material suitable for manufacturing the extendable gripping feet 111, other materials can be used as well. Illustrating by example, in another embodiment the extendable gripping feet 111 are manufactured form polyurethane 402. In still another embodiment, the extendable gripping feet 111 are manufactured from synthetic polyisoprene 403. In still another embodiment, the extendable gripping feet 111 are manufactured from nitrile 404. In still another embodiment, the extendable gripping feet 111 are manufactured from latex 405. Other materials suitable for manufacturing the extendable gripping feet 111, such as rubber, styrene, neoprene, or elastomers 406, will be obvious to those of ordinary skill in the art having the benefit of this disclosure.

Turning now back to FIG. 1, in one or more embodiments an actuation engine 115 is operable to extend and retract the one or more extendable gripping feet 111 from a retracted position where the end surfaces 114 of the one or more extendable gripping feet 111 sit flush with the device housing 113 to an extended position where the end surfaces 114 of the one or more extendable gripping feet 111 situate distally away from the device housing 113. In one or more embodiments, the actuation engine 115 can cause the end surfaces 114 of the one or more extendable gripping feet 111 to situate at locations between the retracted position and the extended position as well.

The extended position and retracted position are shown in FIGS. 2 and 3. Turning briefly to FIGS. 2-3 now, FIG. 2 illustrates a rear elevation view of the electronic device 100 with some extendable gripping feet 111 in regions 201,202 extended to the extended position. Other extendable gripping feet 111 situated in regions 203,204,205 are in the retracted position. As shown in FIG. 3, which is a side elevation view of the electronic device 100, the extendable gripping feet 111 extended to the extended position have their end surfaces 114 extended distally away from a surface 112 of the device housing 113 of the electronic device. By contrast, the extendable gripping feet 111 in the retracted position have their end surfaces 114 situated flush with the surface 112 of the device housing 113 of the electronic device 100.

Note that the extendable gripping feet 111 in region 202 are extended to different lengths, with some extendable gripping feet 111 being in the fully extended position and others being in a partially extended position. This results in the end surfaces 114 of the extendable gripping feet 111 defining a tangent line that is straight across their surfaces despite the fact that the device housing 113 is curved along this region 202. Thus, in one or more embodiments where the extendable gripping feet 111 comprise a plurality of extendable gripping feet, the one or more processors (104) can cause the actuation engine (115) to transition the one or more extendable gripping feet 111 from the retracted position to the extended position by causing some extendable gripping feet of the plurality of extendable gripping feet to extend further from the electronic device 100 than other extendable gripping feet of the plurality of extendable gripping feet.

By contrast, the extendable gripping feet 111 situated in region 201 are all extended to a common distal length from the surface 112 of the device housing 113 due to the fact that the device housing 113 is flat along this region 201. This partial or full extension of the extendable gripping feet 111 allows the end surfaces 114 of the extendable gripping feet 111 to be extended to different lengths to accommodate any appropriate pattern of device housing 113 or surface abutting the device housing 113. Also, note that the extendable gripping feet 111 can be placed on one surface of the device housing 113 or on multiple surfaces of the device housing 113 as shown in FIGS. 2-3.

The actuation engine 115 can take various forms. Turning briefly to FIG. 5, illustrated therein are several examples. Others will be obvious to those of ordinary skill in the art having the benefit of this disclosure.

In one or more embodiments, the actuation engine 115 comprises a motor 501. In other embodiments, the actuation engine 115 is a pneumatic engine 503 that can transition the extendable gripping feet (111) between the retracted position and the extended position. In other embodiments, the actuation engine 115 is a piezoelectric transducer 504. In still other embodiments, the actuation engine 115 is an inflation device 505 using a gas or fluid hydraulic mechanism to transition, or to deflate and inflate, the extendable gripping feet (111) between the retracted position and the extended position.

In one particular embodiment, the actuation engine 115 comprises an electropermanent magnet 502. Electropermanent magnets are well-suited for use in embodiments of the disclosure because once the extendable gripping feet (111) have been transitioned to the retracted position or the extended position, the electropermanent magnet 502 does not need to continue drawing current to keep them in the desired position. This helps to reduce battery drain and extend device operation between recharging cycles.

Turning now back to FIG. 1, in one or more embodiments the one or more sensors 108 of the electronic device 100 detect a condition of the electronic device 100. Examples of such a condition include an identified surface type, an identified surface shape, an identified surface configuration, velocity or movement of the electronic device, active usage of the electronic device, stowing actions or states, user interactions or configurations, and even surface conditions, such as when a surface is wet.

Figure 9:
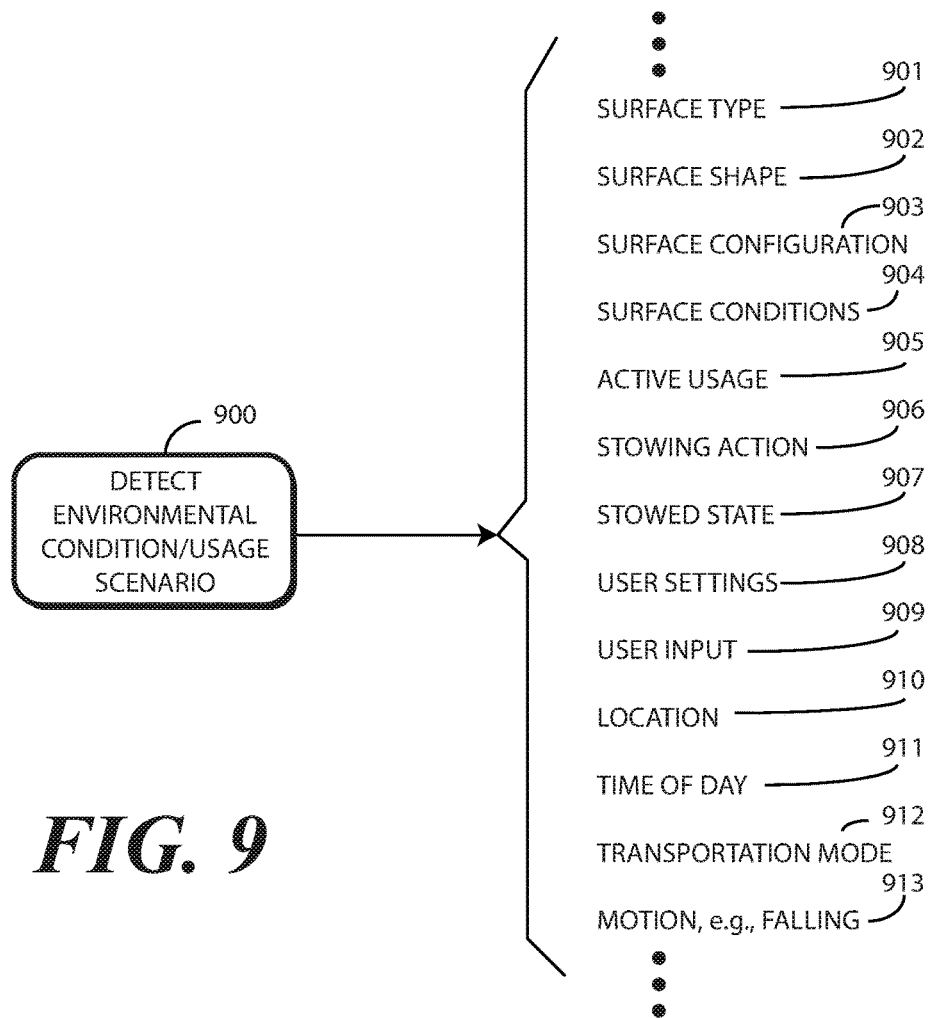
FIG. 9 illustrates one or more explanatory conditions of an electronic device in accordance with one or more embodiments of the disclosure.

Turning briefly to FIG. 9, illustrated therein are some additional conditions 900 that the one or more sensors (108), optionally working in tandem with the environmental and/or context sensing engine (110) can detect. A first example of a condition is a surface type 901. Using an intelligent imager (710), the one or more sensors (108) may be able to capture images of a surface to determine whether it is wood, metal, cement, or another material.

Another example of a condition 900 that the one or more sensors (108) may detect is a surface shape 902. Again illustrating by example, an intelligent imager (710) or depth imager may capture images or depth scans of a surface to determine its particular shape. As noted above with reference to FIGS. 2-3, in one or more embodiments the actuation engine (115) can cause either a partial or full extension of the extendable gripping feet (111), thereby allowing the end surfaces (114) of the extendable gripping feet (111) to be extended to different lengths to accommodate any appropriate pattern of surface abutting the device housing (113). By detecting the surface shape 902, the one or more processors (104) of the electronic device (100) can create an extension map instructing the actuation engine (115) how far to extend each extendable gripping foot of the extendable gripping feet (111).

Another example of a condition 900 the one or more sensors (108) may detect is a surface configuration 903. If, for example, a surface is part stainless steel and part rubber, the one or more processors (104) can use this information to create an extension map instructing the actuation engine (115) regarding which extendable gripping feet to transition from the retracted position to the extended position and/or by how much. The one or more processors (104) may elect to only extend extendable gripping feet situated along the rubber portion of the surface to the extended position since the coefficient of friction between those extendable gripping feet and the rubber portion of the surface will be higher. Similarly, the surface configuration 903 may comprise a surface angle. The one or more processors (104) may elect to extend extendable gripping feet positioned on the lower side of the electronic device (100) to serve as a chock that prevents the electronic device (100) from sliding down the surface, and so forth.

Still another example of a condition 900 that the one or more sensors (108) may detect is a surface condition 904. For instance, the moisture detector (708) may detect whether there is moisture on a surface. Since electronic devices can be damaged by moisture, extension of the extendable gripping feet (111) from the retracted position to the extended position may raise the device housing (113) of the electronic device (100) out of the moisture. Additionally, transitioning the extendable gripping feet (111) to the extended position may prevent the electronic device (100) from sliding in the moisture as well.

Still another example of a condition 900 the one or more sensors (108) can detect is active usage 905 of the electronic device (100). If, for example, the motion detector (704) detects that the electronic device (100) is moving, or the force sensors (705) determine that the electronic device (100) is being gripped, or the galvanic sensor (709) determines that perspiration is on the device housing (113), the one or more processors (104) may cause the extendable gripping feet (111) to transition from the retracted position to the extended position to make the electronic device (100) easier to grip.

Still another example of a condition 900 the one or more sensors (108) can detect is a stowing action 906. If, for example, the motion detector (704) detects the electronic device (100) moving downward, with the light sensor (713) thereafter detecting a change from light being incident upon the device housing (113) to no light being present on the device housing (113), the one or more processors (104) may cause the actuation engine (115) to transition at least some of the extendable gripping feet (111) to the extended position so that they can grab the inside of a pocket, backpack, or purse so as not to slide around while being stowed. A stowed state 907 can be similarly detected to produce similar action.

Another example of a condition 900 the one or more sensors (108) can detect one or more user settings 908. A user may wish, for example, for the one or more processors (104) to extend the extendable gripping feet (111) to the extended position whenever the direction of gravity is oriented substantially parallel with the major surfaces of the electronic device (100) (i.e., the electronic device (100) is flat) since that is the orientation the electronic device (100) is most likely to take when the electronic device (100) is placed upon a surface. Similarly, a user may want the one or more processors (104) to cause the actuation engine (115) to transition the extendable gripping feet (111) to the extended position when the motion detector (704) determines that the electronic device (100) is motionless, and so forth. User settings 908 or user input 909 can be used to identify which of these conditions the one or more sensors (108) should detect.

Another example of a condition 900 the one or more sensors (108) can detect is a location 910. The location detector (702) can determine where the electronic device (100) is, and the one or more processors (104) can use this information to cause the actuation engine (115) to extend or retract the extendable gripping feet (111). If, for example, the electronic device (100) is in the same place at a particular time of day, e.g., in a person's home or car, the one or more sensors (108) can detect this as a predefined condition that corresponds to an extended or retracted state of the extendable gripping feet (111). Time of day 911 can be used independently of, or in combination with, location 910 to achieve similar results.

Another example of a condition 900 the one or more sensors (108) can detect is a transportation mode 912. The user may prefer extendable gripping feet (111) on the rear surface (112) of the device housing (113) to extend to match the contours of a dashboard, cup holder, or seat when the electronic device (100) is in a car in motion, but may want other extendable gripping feet (111) to extend when the user is walking and the electronic device (100) is in a pocket. The one or more sensors (108) can detect this information and deliver it to the environmental and/or context sensing engine 110 in one or more embodiments.

Still another condition 900 the one or more sensors (108) can detect is device motion 913. If, for example, a user drops the electronic device (100), the motion detectors (704) can detect this. The one or more processors (104) may then cause the actuation engine (115) to transition the extendable gripping feet (111) from the retracted position to the extended position so as to protect the electronic device (100) from impact, and so forth. The examples of conditions 900 shown in FIG. 9 are illustrative only. Numerous others will be obvious to those of ordinary skill in the art having the benefit of this disclosure.

Turning now back to FIG. 1, in response to the one or more sensors 108 detecting the condition of the electronic device 100, the one or more processors 104 cause the actuation engine 115 to transition the one or more extendable gripping feet 111 from the retracted position to the extended position where the one or more extendable gripping feet 111 extend distally away from the electronic device 100.

The one or more sensors 108 can identify the condition in a variety of ways. Illustrating by example, as described above the one or more sensors 108 can include an intelligent imager (710) or near field communication circuit (703) that may acquire characteristics of a surface. In one or more embodiments, these acquired characteristics can be compared with a database of surfaces and associated characteristics stored in the memory 105 of the electronic device 100 to make a determination of what type of surface, what shape of surface, what material or surface, or what condition of surface (e.g., wet or dry, waxed or high-friction, etc.) is abutting the surfaces of the device housing 113 of the electronic device 100. In other embodiments, a surface may be measured using an intelligent imager (710) that is activated during device movement detected by the motion detectors (704).

In still other embodiments, a condition may be determined from a location identified by the location detector (702). For instance, if the one or more sensors 108 of the electronic device 100 determine that the electronic device 100 is in the same place at a particular time of day, such as a person's home or car, and so forth, the one or more sensors 108 may make a probabilistic guess regarding the condition of the electronic device 100 that informs the one or more processors 104 regarding whether the actuation engine 115 should transition the one or more extendable gripping feet 111 from the retracted position to the extended position.

In still other embodiments, the one or more sensors 108 may detect a condition directly. A moisture detector (708), for example, may detect directly that a surface is wet. To prevent the electronic device 100 from sliding, or alternatively to lift the electronic device 100 out of the moisture, the one or more processors 104 may cause the actuation engine 115 to transition the one or more extendable gripping feet 111 from the retracted position to the extended position.

In still other embodiments, the one or more sensors 108 may detect movement toward a surface or an in-use state to detect the condition. For instance, an accelerometer located in a motion detector (704) and/or an intelligent imager (710) or other image capture device may be used to determine movement of the electronic device 100 and trajectory. The image capture device can be used to detect and identify— through image recognition—a surface approaching the electronic device 100 so that the one or more processors 104 can cause the actuation engine 115 to transition the one or more extendable gripping feet 111 to the retracted position, the extended position, or somewhere in between, before the electronic device 100 makes contact with the surface. Usage of the electronic device 100 can be detected in many ways as the condition, including by way of an image capture device, which applications are operating on the electronic device 100, and so forth.

In one or more embodiments, only some of the one or more extendable gripping feet 111 are transitioned from the retracted position to the extended position in response to the one or more sensors detecting a predefined condition. One example of this is shown in FIGS. 2-3. For instance, depending upon the surface characteristics and device dimensions, in one or more embodiments the one or more processors 104 will cause the actuation engine 115 to transition some of the extendable gripping feet 111 to extended positions while others remain in the retracted position so that the contour defined by the end surfaces 114 of the extendable gripping feet 111 match the surface contours of the surface. This mapping can be a function of other factors, including even motion. If the one or more sensors 108 detect that the electronic device 100 is in a vehicle, they may cause the actuation engine 115 to transition some of the extendable gripping feet 111 to extended positions while others remain in the retracted position so that the contour defined by the end surfaces 114 of the extendable gripping feet 111 match the surface contours of the interior of a vehicle, and so forth.

The one or more sensors 108 may also detect—or estimate—a coefficient of friction of the surface so that the one or more processors 104 can selectively cause the actuation engine 115 to transition some of the extendable gripping feet 111 from the retracted position to the extended position. If, for example, the electronic device 100 is sitting on the fold-out tray of an airplane, which is typically quite slick, the one or more processors 104 may cause the actuation engine 115 to transition all of the extendable gripping feet 111 situated on a surface abutting the fold-out tray. By contrast, if the electronic device 100 is situated on something covered with shag carpet, only a few of the extendable gripping feet 111 may be extended, as the carpet has a high coefficient of friction.

Thus, as shown and described above with reference to FIGS. 2-3, where the one or more extendable gripping feet 111 comprise a plurality of extendable gripping feet, in one or more embodiments the one or more processors 104 cause the actuation engine to transition the one or more extendable gripping feet 111 from the retracted position to the extended position by causing the actuation engine 115 to transition a first subset of the plurality of extendable gripping feet 111 (e.g., those in regions (201,202)) when the condition is a first condition (such as in a pocket) or causing the actuation engine 115 to transition a second subset of the plurality of extendable gripping feet 111 (e.g., those in regions (203, 204,205)) when the condition is a second condition such as being situated on a table. In still other embodiments, the one or more processors 104 may cause the actuation engine 115 to transition the one or more extendable gripping feet 111 from the retracted position to the extended position by causing the actuation engine 115 to transition all extendable gripping feet 111 of the plurality of extendable gripping feet 111 when the condition is a third condition such as when the electronic device 100 is being dropped to the ground.

In one or more embodiments, the memory 105 stores one or more extension maps 107 for the one or more extendable gripping feet 111. In one or more embodiments, the one or more extension maps 107 provide indications of how far each extendable gripping foot of the extendable gripping feet 111 should be extended for given conditions detected by the one or more sensors 108. The one or more extension maps 107 can correspond to one or more conditions detectable by the one or more sensors 108. If, for example, the one or more sensors 108 detect an in-pocket condition, the one or more processors 104 may reference an in-pocket extension map to determine both which extendable gripping feet 111 to extend and by how much. The one or more extension maps 107 may comprise a database of known surfaces and their associated characteristics.

In one or more embodiments, the one or more processors 104 further, in response to the one or more sensors 108 detecting a predefined condition, retrieve an extension map corresponding to the condition from the memory 105. Thereafter, the one or more processors 104 may cause the actuation engine 115 to transition the one or more extendable gripping feet 111 from the retracted position to the extended position occurs in accordance with the extension map retrieved from the memory 105. For example, when the one or more sensors 108 detect a surface contour of a particular surface, the one or more processors 104 may cause the actuation engine 115 to transition the one or more extendable gripping feet 111 from the retracted position to the extended position in accordance with an extension map that is a function of the surface contour of the surface, and so forth.

One of the principal advantages of including the extendable gripping feet 111 with the electronic device 100 is that their extension can prevent the electronic device 100 from sliding along a surface. Embodiments of the disclosure contemplate that surfaces can be slick (e.g., when the surface is glass or stainless steel) and can be uneven (e.g., an artists table or seat-back tray in an unleveled airplane or boat). When a motion detector (704) is included with the one or more sensors 108, the one or more sensors 108 can detect a translation condition (e.g., the electronic device 100 sliding) between a surface in contact with the electronic device 100 and the device housing 113 of the electronic device 100. When this occurs, the one or more processors 104 can cause the actuation engine 115 to transition the one or more extendable gripping feet 111 from the retracted position to the extended position where the end surfaces 114 of the one or more extendable gripping feet 111, with their higher friction coefficient than the surfaces of the device housing 113 of the electronic device 100, situate distally away from the electronic device 100. Advantageously, this causes the translation condition to subside, diminish, or cease. Illustrating by example, if the one or more sensors 108 include an image capture device such as the intelligent imager (710) described above, the one or more sensors 108 can detect the translation condition of a surface that is in contact with the electronic device 100 sliding, moving, or otherwise changing by capturing one or more images of the surface with the image capture device, and so forth.

For each of the conditions detected, embodiments of the disclosure contemplate that when the condition ceases, the one or more processors 104 will cause the actuation engine 115 to transition the one or more extendable gripping feet 111 from the extended position to the retracted position. Thus, if the detected condition is a translation condition with the electronic device 100 sliding across a surface, the one or more processors 104 may cause the actuation engine 115 to transition the one or more extendable gripping feet 111 from the extended position to the retracted position in response to the one or more sensors 108 detecting an absence of the translation condition, and so forth.

It is to be understood that FIG. 1 is provided for illustrative purposes only and for illustrating components of one electronic device 100 in accordance with embodiments of the disclosure and is not intended to be a complete schematic diagram of the various components required for an electronic device 100. Therefore, other electronic devices configured in accordance with embodiments of the disclosure may include various other components not shown in FIG. 1 or may include a combination of two or more components or a division of a particular component into two or more separate components, and still be within the scope of the present disclosure.

Figure 6:
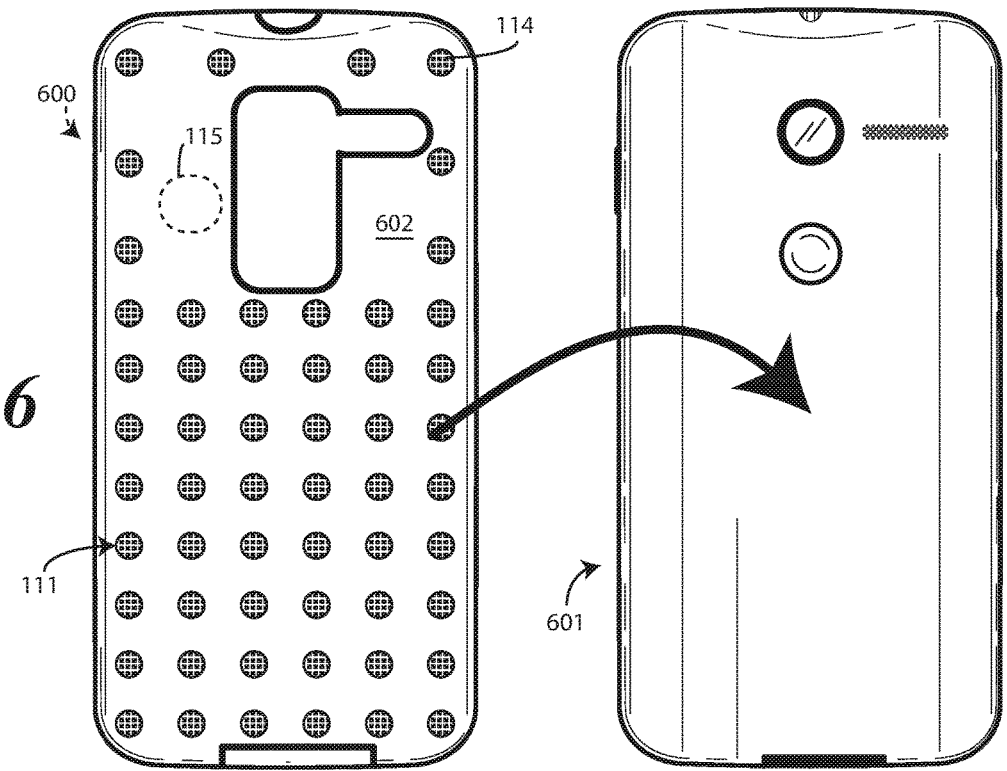
FIG. 6 illustrates one explanatory cover for an electronic device in accordance with one or more embodiments of the disclosure.

As shown in FIG. 1, the one or more extendable gripping feet (111) can be integrated into the device housing (113) of an electronic device (100). Alternatively, they can be incorporated into a case in other embodiments. Turning now to FIG. 6, illustrated therein is one such embodiment.

As shown in FIG. 6, in one or more embodiments a case 600, which can be coupled to an electronic device 601, carries one or more extendable gripping feet 111. When an actuation engine 115 carried by the case 600 transitions the extendable gripping feet 111 to the extended position, the end surfaces 114 of the extendable gripping feet 111 situate distally away from the surface 602 of the case 600. By contrast, when the actuation engine 115 transitions the extendable gripping feet 111 to the retracted position, such as at the cessation of a predefined condition, in one or more embodiments the end surfaces 114 sit flush with the exterior surface 602 of the case 600. The actuation engine 115 can be operable with one or more sensors carried by the case 600 in one or more embodiments. Alternatively, in other embodiments the case 600 may include electrical connections coupling the actuation engine 115 to one or more sensors (108) carried by the electronic device 601. When the one or more sensors (108) carried by the electronic device 601 detect a predefined condition, signals can be communicated through the electrical connections that cause the actuation engine 115 to transition the one or more extendable gripping feet 111 to the retracted position, the extended position, or locations in between.

Figure 8:
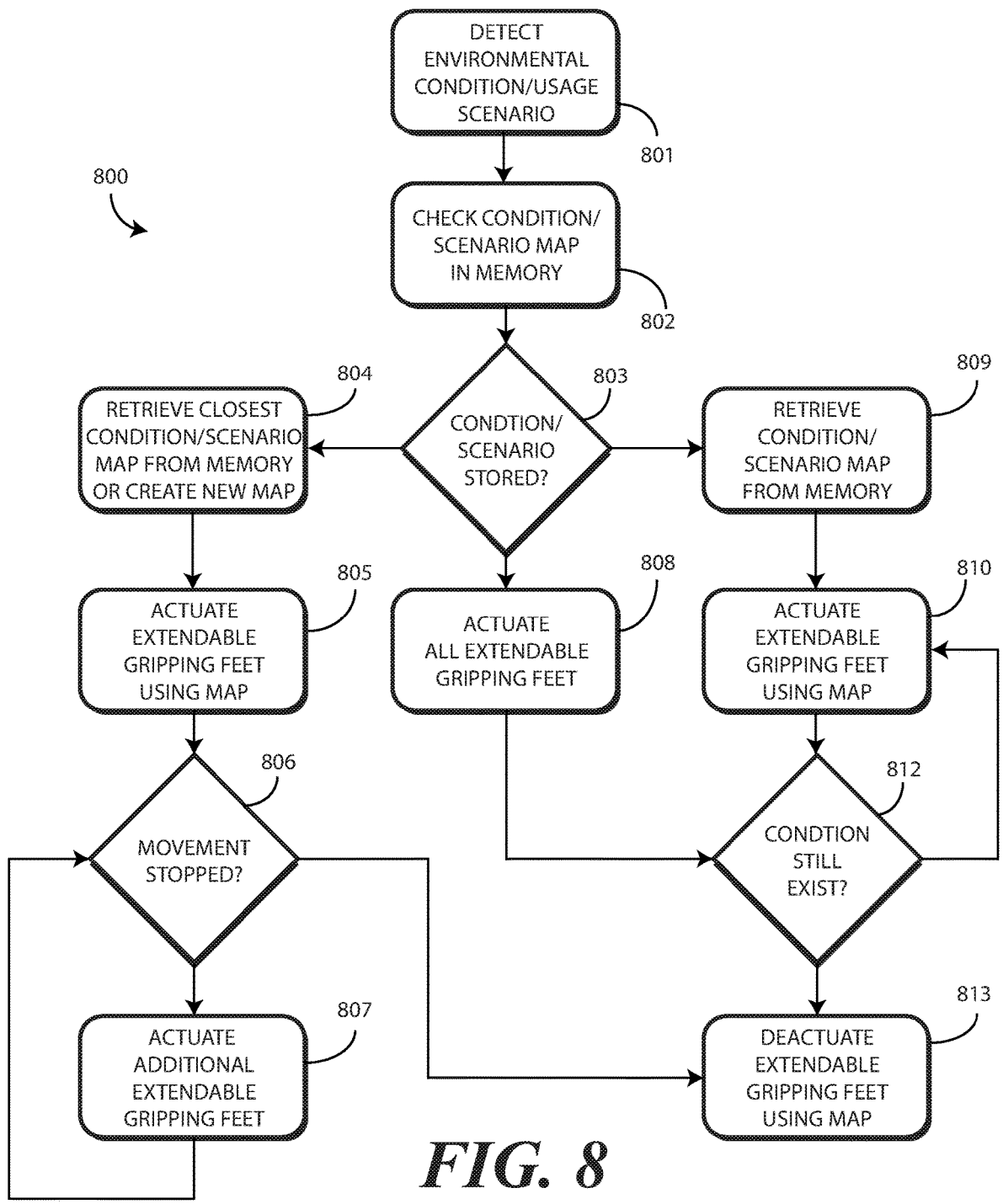
FIG. 8 illustrates one explanatory method in accordance with one or more embodiments of the disclosure.

Turning now to FIG. 8, illustrated therein is one explanatory method 800 suitable for use with the electronic device (100) of FIG. 1, the case (600) of FIG. 6, or other electronic devices configured in accordance with embodiments of the disclosure. Many of the steps of the method 800 have been described above with reference to FIGS. 1-7. Accordingly, those so previously described will only briefly be described with reference to FIG. 8 in the interest of brevity.

Beginning at step 801, one or more sensors of an electronic device detect a condition of the electronic device. The condition can be any of those described above with reference to FIG. 9, or alternatively those described above with reference to FIG. 1. Illustrating by example, in one or more embodiments the condition detected at step 801 comprises an identified surface being in contact with one of the device housing when the electronic device is configured as described above with reference to FIG. 1, or alternatively a case when the electronic device is configured as a case as described above with reference to FIG. 6. Alternatively, the condition can comprise a velocity of the electronic device. The condition can also be a usage mode of the electronic device. Similarly, the condition can comprise moisture being in contact with the electronic device, and so forth.

At step 802, the method 800 checks a memory of the electronic device to determine whether an extension map corresponding to the condition detected at step 801 exists for one or more extendable gripping feet carried by the electronic device when the electronic device is configured as described above with reference to FIG. 1, or alternatively a case when the electronic device is configured as a case as described above with reference to FIG. 6. Decision 803 then determines whether an extension map corresponding to one or more conditions detected by the one or more sensors at step 801 are stored in the memory. Where it is, the method 800 moves to step 809. Otherwise, the method 800 moves to step 804.

At step 809, the method 800 retrieves an extension map corresponding to the condition detected at step 801 from the memory. At step 810, the method 800 causes an actuation engine to transition one or more extendable gripping feet from the retracted position to the extended position in accordance with the extension map retrieved from the memory.

Decision 812 then determines whether the condition is still occurring. Where it is, the method 800 returns to step 810. Where it is not, the method 800 causes the actuation engine to transition the one or more extendable gripping feet from the extended position to the retracted position in accordance with the extension map retrieved from the memory.

Where there is no extension map corresponding to the condition detected at step 801, at step 804 the method 800 can either retrieve the closest existing extension map to that of the detected condition or can create a new extension map through trial and error. For example, at step 805 the method 800 causes the actuation engine to transition one or more extendable gripping feet from the retracted position to the extended position in accordance with either its best guess based upon the condition detected at step 801, or alternatively in accordance with the closest extension map retrieved from the memory. Decision 806 can determine whether the condition has stopped. If it has, the method 800 can proceed to step 813 as previously described. Otherwise, machine learning can occur at step 807 where the method 800 comprises trying different combinations of extendable gripping feet and extension amounts of end surfaces of the extendable gripping feet until the condition detected at step 801 stops.

In other situations where there is no extension map corresponding to the condition detected at step 801, the method 800 can comprise simply processors causing, in response to the condition detected at step 801, an actuation engine to transition all of the extendable gripping feet from the a retracted position to the extended position. The method 800 can then proceed to decision 812 as previously described. In each of steps 805,807,808, and 810, it should be noted that the end surfaces of the one or more extendable gripping feet situate flush with one of a device housing or a case coupled to the device housing when in the retracted position and situate distally from the one of the device housing or the case in the extended position. The extendable gripping feet are in an extended state when in the extended position and in a retracted state when in the retracted position. Of course, as previously described the end surfaces of the extendable gripping feet can situate in positions between the retracted position and the extended position as well.

Figure 10:
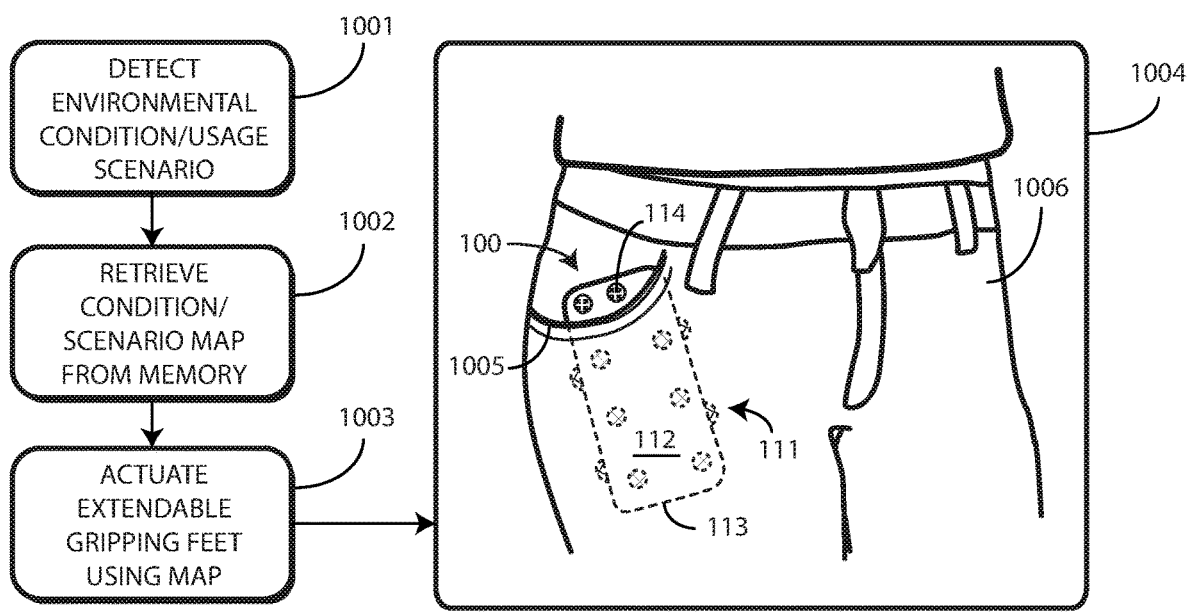
FIG. 10 illustrates one or more explanatory method steps in accordance with one or more embodiments of the disclosure.

Turning now to FIG. 10, illustrated therein are one or more method steps that illustrate one practical application for the method (800) of FIG. 8. In FIG. 10, an electronic device 100 includes one or more sensors (108), one or more processors (104) operable with the one or more sensors (108), and one or more extendable gripping feet 111. An actuation engine (115) is operable to extend and retract the one or more extendable gripping feet 111 as previously described. The one or more sensors (108) detect a condition of the electronic device 100 and, in response to the one or more sensors (108) detecting the condition, the one or more processors (104) cause the actuation engine (115) to transition at least some of the one or more extendable gripping feet 111 from a retracted position where end surfaces 114 of the one or more extendable gripping feet 111 sit flus with the device housing 113 to an extended position where the one or more extendable gripping feet 111 extend distally away from the electronic device 100 with end surfaces 114 of the extendable gripping feet 111 situated distally away from the device housing 113.

Beginning at step 1001, the one or more sensors (108) detect a condition of the electronic device 100. In the illustrative embodiment of FIG. 10, the condition detected is an in-pocket condition. This detection can occur in a number of different ways.

Illustrating by example, using a motion detector (704), a touch sensor (701), and a temperature sensor (714), or alternatively one or more proximity sensor components (707), one or more processors (104) of the electronic device 100 detect one or more conditions to determine that the electronic device 100 is disposed within the pocket 1005.

In one or more embodiments, the one or more processors (104) can determine motion of the electronic device 100 from the motion detector (704) and can extract parametric data to confirm that this motion corresponds to human movement or motion of a human's body. The temperature sensor (714), or alternatively the one or more proximity sensor components (707), can determine whether a temperature disposed at a first location and a second location of the electronic device 100 is an approximately common temperature.

It should be noted that the first location and the second location can be located on the same side or end of the electronic device 100 in one embodiment. For example, in the illustrative embodiment of FIG. 10, the first end of the electronic device 100 sticks out of the pocket 1005 and is exposed to the environment while the second end of the electronic device 100 is situated within, and at the bottom of, the pocket 1005. Accordingly, the first end and the second end can be expected to experience different temperatures. Thus, in this configuration it is advantageous that the first location and the second location are disposed at the same end of the electronic device 100, i.e., the second end. In other embodiments, however, such as when the electronic device 100 is completely disposed within the pocket 1005, it can be advantageous to have the first location and the second location disposed at opposite ends, i.e., one at the first end and one at the second end of the electronic device 100. By placing proximity sensor components (707) about the perimeter of the device housing 113, the one or more processors (104) can select where the first location and the second location are on a case-by-case basis.

The touch sensor (701) can detect an absence of finger touch along the device housing 113. The one or more processors (104) can then confirm that the electronic device 100 is disposed within the pocket 1005, in one embodiment, when the movement includes parametric data corresponding to human movement, the absence of finger touch is confirmed, and the temperature at both the first end and the second end is an approximately common temperature.

At step 1002, the one or more processors (104) of the electronic device 100 retrieve, from a memory (105) of the electronic device 100, an extension map indicating which extendable gripping feet of the one or more extendable gripping feet 111 should be extended and by how much.

As noted above with reference to FIG. 8, where there is no extension map corresponding to the condition detected at step 1001, at step 1002 one or more processors (104) can either retrieve the closest existing extension map to that of the detected condition or can create a new extension map through trial and error. In this illustrative embodiment, an in-pocket condition is very common, so an extension map for in-pocket conditions is retrieved at step 1002.

At step 1003, the one or more processors (104) cause the actuation engine (115) to transition the one or more extendable gripping feet 111 from a retracted position to an extended position where the one or more extendable gripping feet 111 extend distally away from the electronic device 100. As shown at step 1004, in this illustrative embodiment step 1003 comprises transitioning the extendable gripping feet situated along the minor faces of the device housing 113 to the extended position to retain the sides of the electronic device 100 in the pocket. However, to make it easy for the user 1006 to slide their hand into the pocket 1005, the extendable gripping feet situated on the rear major surface 112 of the device housing 113 remain in the retracted position. Accordingly, step 1004 includes causing only some of the one or more extendable gripping feet 111 to transition to the extended position while retaining some other of the extendable gripping feet 111 in the retracted position in accordance with the extension map retrieved at step 1002.

Figure 11:
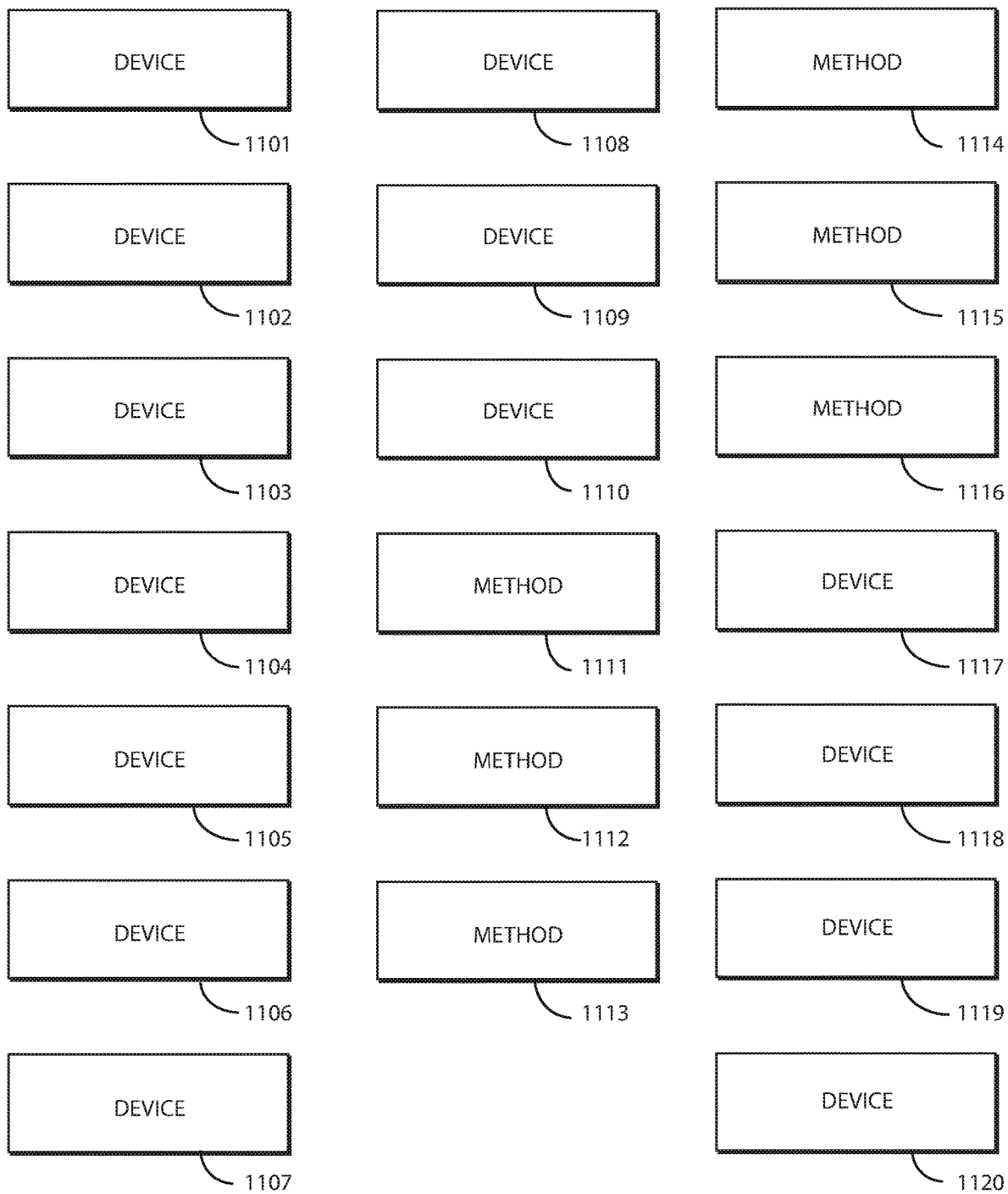
FIG. 11 illustrates various embodiments of the disclosure.

Turning now to FIG. 11, illustrated therein are various embodiments of the disclosure. The embodiments of FIG. 11 are shown as labeled boxes in FIG. 11 in accordance with 37 CFR § 1.83(a) due to the fact that the individual components of these embodiments have been illustrated in detail in FIGS. 1-10, which precede FIG. 11. Accordingly, since these items have previously been illustrated and described, their repeated illustration is no longer essential for a proper understanding of these embodiments. Thus, the embodiments are shown as labeled boxes.

At 1101, an electronic device comprises one or more sensors. At 1101, the electronic device comprises one or more processors operable with the one or more sensors.

At 1101, the electronic device comprises one or more extendable gripping feet. At 1101, the electronic device comprises an actuation engine operable to extend and retract the one or more extendable gripping feet.

At 1101, the one or more sensors detecting a condition of the electronic device. At 1101, in response to the one or more sensors detecting the condition, the one or more processors cause the actuation engine to transition the one or more extendable gripping feet from a retracted position to an extended position where the one or more extendable gripping feet extend distally away from the electronic device.

At 1102, the electronic device of 1101 further comprises a device housing. At 1102, end surfaces of the one or more extendable gripping feet sit flush with the device housing in the retraced position and situate distally away from the device housing in the extended position.

At 1103, the electronic device of 1101 further comprises a case coupled to the electronic device. At 1103, the one or more extendable gripping feet are carried by the case. At 1103, end surfaces of the one or more extendable gripping feet sit flush with an exterior surface of the case in the retracted position. At 1103, the end surfaces of the one or more extendable gripping feet situate distally away from the case in the extended position.

At 1104, the one or more extendable gripping feet of 1101 comprise a plurality of extendable gripping feet. At 1104, the one or more processors causing the actuation engine to transition the one or more extendable gripping feet from the retracted position to the extended position by causing the actuation engine to transition a first subset of the plurality of extendable gripping feet when the condition is a first condition, or by causing the actuation engine to transition a second subset of the plurality of extendable gripping feet when the condition is a second condition.

At 1105, the one or more processors of 1104 cause the actuation engine to transition the one or more extendable gripping feet from the retracted position to the extended position by causing the actuation engine to transition all extendable gripping feet of the plurality of extendable gripping feet when the condition is a third condition.

At 1106, the electronic device of 1101 further comprises a device housing. At 1106, end surfaces of the one or more extendable gripping feet situate distally away from the device housing in the extended position. At 1106, the end surfaces of the one or more extendable gripping feet have a higher coefficient of friction than surfaces of the device housing.

At 1107, the actuation engine of 1106 comprises one or more electropermanent magnets operable to transition the one or more extendable gripping feet between the retracted position and the extended position.

At 1108, the one or more extendable gripping feet of 1101 comprise a plurality of extendable gripping feet. At 1108, the one or more processors cause the actuation engine to transition the one or more extendable gripping feet from the retracted position to the extended position by causing some extendable gripping feet of the plurality of extendable gripping feet to extend further from the electronic device than other extendable gripping feet of the plurality of extendable gripping feet.

At 1109, the electronic device of 1101 further comprises a memory operable with the one or more processors. At 1109, the memory stores one or more extension maps for the one or more extendable gripping feet corresponding to one or more conditions detectable by the one or more sensors.

At 1110, the one or more processors of 1109 further, in response to the one or more sensors detecting the condition, retrieve an extension map corresponding to the condition from the memory. At 1110, the one or more processors cause the actuation engine to transition the one or more extendable gripping feet from the retracted position to the extended position in accordance with the extension map retrieved from the memory.

At 1111, a method comprises one or more sensors detecting a condition of an electronic device. At 1111, the method comprises one or more processors causing, in response to the one or more sensors detecting the condition, an actuation engine to transition one or more extendable gripping feet to transition from a retracted state where end surfaces of the one or more extendable gripping feet situate flush with one of a device housing or a case coupled to the device housing to an extended state where the end surfaces situate distally from the one of the device housing or the case.

At 1112, the condition of 1111 comprises an identified surface in contact with the one of the device housing or the case. At 1113, the condition of 1111 comprises a velocity of the electronic device. At 1114, the condition of 1111 comprises a usage mode of the electronic device. At 1115, the condition of 1111 comprises a stowage state of the electronic device. At 1116, the condition of 1111 comprises moisture in contact with the one of the device housing or the case.

At 1117, an electronic device comprises one or more sensors detecting a translation condition between the electronic device and a surface in contact with the electronic device. At 1117, the electronic device comprises one or more processors causing an actuation engine to transition one or more extendable gripping feet from a retracted position to an extended position where end surfaces of the one or more extendable gripping feet having a higher friction coefficient than surfaces of the electronic device situate distally from the electronic device, thereby causing the translation condition to cease.

At 1118, the one or more sensors of 1117 comprise an image capture device. At 1118, the translation condition comprises a surface being in contact with the electronic device. At 1118, the one or more sensors detect the translation condition by capturing one or more images of the surface with the image capture device.

At 1119, the one or more sensors of 1118 further detect a surface contour of the surface. At 1119, the one or more processors cause the actuation engine to transition the one or more extendable gripping feet from the retracted position to the extended position in accordance with an extension map that is a function of the surface contour of the surface. At 1120, the one or more processors of 1117 cause the actuation engine to transition the one or more extendable gripping feet from the extended position to the retracted position in response to the one or more sensors detecting an absence of the translation condition.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims.

Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. An electronic device, comprising:
one or more sensors detecting a translation condition between the electronic device and a surface in contact with the electronic device; and
one or more processors causing an actuation engine to transition one or more extendable gripping feet from a retracted position to an extended position where end surfaces of the one or more extendable gripping feet having a higher friction coefficient than surfaces of the electronic device situate distally from the electronic device, thereby causing the translation condition to cease.

2. The electronic device of claim 1, wherein:
the one or more sensors comprise an image capture device;
the translation condition comprises a surface being in contact with the electronic device; and
the one or more sensors detect the translation condition by capturing one or more images of the surface with the image capture device.

3. The electronic device of claim 2, the one or more sensors further detecting a surface contour of the surface, wherein the one or more processors cause the actuation engine to transition the one or more extendable gripping feet from the retracted position to the extended position in accordance with an extension map that is a function of the surface contour of the surface.

4. The electronic device of claim 1, the one or more processors causing the actuation engine to transition the one or more extendable gripping feet from the extended position to the retracted position in response to the one or more sensors detecting an absence of the translation condition.

5. The electronic device of claim 1, wherein distal ends of the one or more extendable gripping feet sit flush with surfaces of the electronic device when in the retracted position.

6. The electronic device of claim 1, further comprising a case coupled to the electronic device, wherein the one or more extendable gripping feet are carried by the case.

7. The electronic device of claim 6, wherein end surfaces of the one or more extendable gripping feet sit flush with an exterior of the surface of the case when in the retracted position.

8. The electronic device of claim 7, wherein the end surfaces of the one or more extendable gripping feet situate distally away from the case in the extended position.

9. The electronic device of claim 1, wherein the one or more extendable gripping feet are cylindrical.

10. The electronic device of claim 1, wherein the one or more extendable gripping feet are semi-rigid.

11. The electronic device of claim 1, wherein the one or more extendable gripping feet are manufactured from silicone.

12. The electronic device of claim 11, wherein the silicone is translucent.

13. The electronic device of claim 11, wherein the silicone is backlit.

14. The electronic device of claim 11 wherein the silicone and the electronic device are the same color.

15. The electronic device of claim 1, wherein the one or more extendable gripping feet define a subset of a plurality of extendable gripping feet carried by the electronic device.

16. The electronic device of claim 1, wherein the one or more extendable gripping feet comprise a plurality of extendable gripping feet.

17. The electronic device of claim 1, wherein the actuation engine is a pneumatic engine.

18. The electronic device of claim 1, wherein the actuation engine comprises an electropermanent magnet.

19. The electronic device of claim 1, wherein the translation condition is caused by moisture.

20. The electronic device of claim 1, wherein the surface is one of a pocket, a backpack, a purse, glass, or stainless steel.

\* \* \* \* \*